United States Patent
Lin et al.

(10) Patent No.: US 6,985,708 B2
(45) Date of Patent: Jan. 10, 2006

(54) LINEARIZED FRACTIONAL-N SYNTHESIZER HAVING A GATED OFFSET

(75) Inventors: Tsung-Hsien Lin, Los Angeles, CA (US); Hung-Ming Chien, Los Angeles, CA (US)

(73) Assignee: Broadcom, Corp., Irvine, CA (US)

( * ) Notice: Subject to any disclaimer, the term of this patent is extended or adjusted under 35 U.S.C. 154(b) by 594 days.

(21) Appl. No.: 10/170,849

(22) Filed: Jun. 12, 2002

(65) Prior Publication Data

US 2003/0232610 A1    Dec. 18, 2003

(51) Int. Cl.
*H04B 1/06*    (2006.01)
(52) U.S. Cl. .................. 455/260; 455/316; 375/376
(58) Field of Classification Search ............. 455/258, 455/259, 260, 313, 255, 316; 375/376; 331/156, 331/157, 158, 159
See application file for complete search history.

(56) References Cited

U.S. PATENT DOCUMENTS

| | | | |
|---|---|---|---|
| 5,631,587 A * | 5/1997 | Co et al. ............... | 327/107 |
| 5,783,972 A * | 7/1998 | Nishikawa ............... | 331/17 |
| 6,563,387 B2 * | 5/2003 | Hirano et al. ........... | 331/11 |
| 2002/0097825 A1 * | 7/2002 | Kawahara ............... | 375/376 |
| 2003/0189463 A1 * | 10/2003 | Walker ................... | 331/17 |

* cited by examiner

Primary Examiner—Nguyen T. Vo
Assistant Examiner—Nhan T. Le
(74) Attorney, Agent, or Firm—Garlick, Harrison & Markison, LLP; Timothy W. Markison

(57) ABSTRACT

A linearized oscillation synthesizer includes a phase and frequency detection module, charge pump circuit, low pass filter, voltage control oscillator, and a feedback module. The phase and frequency detection module is operably coupled to produce a charge-up signal, a charge-down signal, and an off signal based on phase and/or frequency differences between a reference oscillation and a feedback oscillation. The reference oscillation is generated by a clock source such as a crystal oscillator while the divider module generates the feedback oscillation by dividing the output oscillation by a divider value. The charge pump circuit produces a positive current in response to the charge-up signal, a negative current in response to the charge-down signal and also produces a non-zero offset current. The non-zero offset current shifts the steady state operating condition, and other operating conditions, of the charge pump into a linear region of charge pump performance curve.

18 Claims, 15 Drawing Sheets local oscillation module 74 charge pump 102 & loop filter 104 charge pump 102 &
loop filter 104 charge pump functionality w/o current offset charge pump functionality w/ current offset

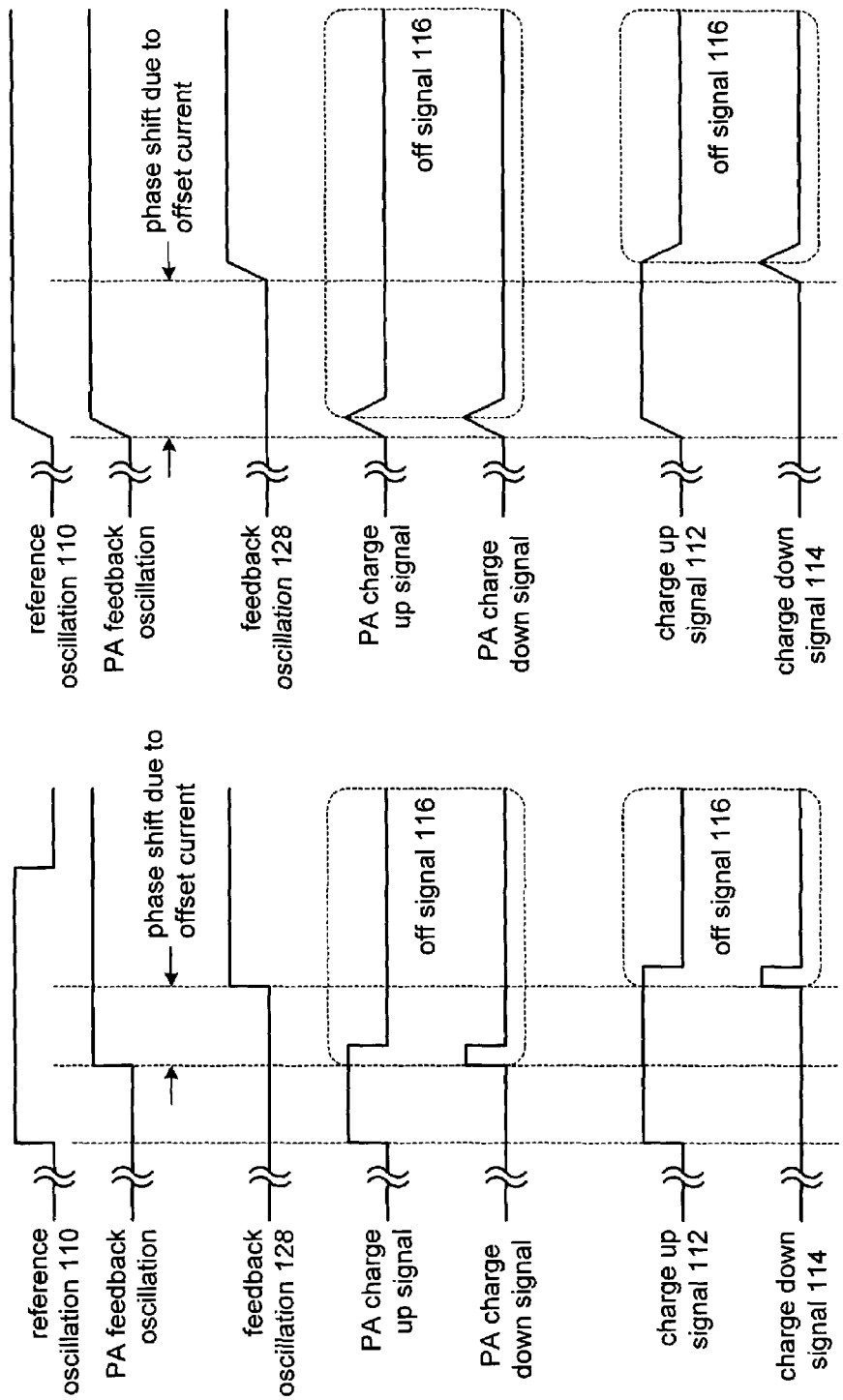

linearized fractional-N synthesizer 165 fractional N synthesizer 180 fractional N synthesizer 190 local oscillation module 74

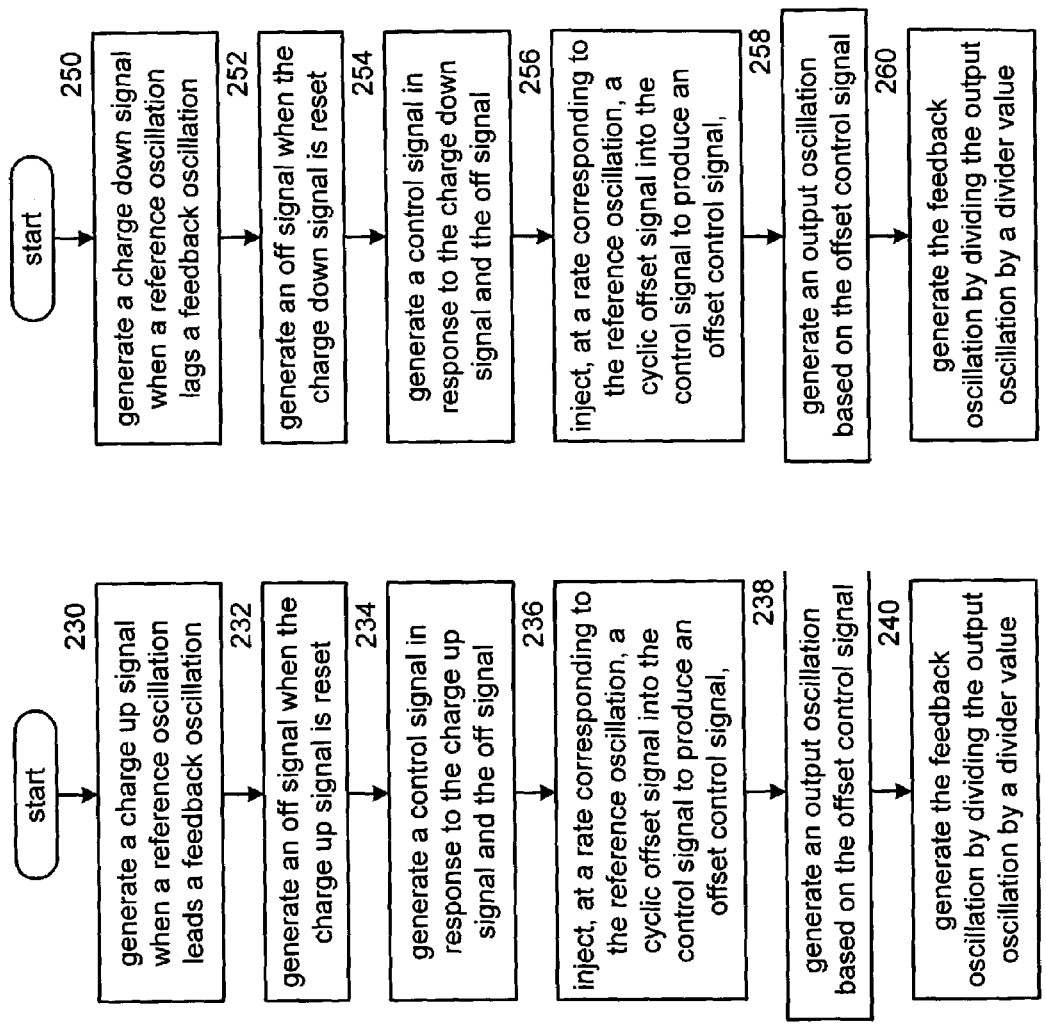

LINEARIZED FRACTIONAL-N SYNTHESIZER HAVING A GATED OFFSET

CROSS REFERENCE TO RELATED PATENTS

The present patent is related to co-pending patent application entitled LINEARIZED FRACTIONAL-N SYNTHESIZER WITH FIXED CHARGE PUMP OFFSET, U.S. Ser. No. 10/167,811, and filing date of Jun. 12, 2002.

BACKGROUND OF THE INVENTION

1. Technical Field of the Invention

This invention relates generally to wireless communication systems and more particularly to radio frequency integrated circuits used in such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

The local oscillations used in both the transmitter and receiver may be produced by the same or different local oscillation generators. In either case, a local oscillator generator is typically implemented using a fractional N-synthesizer. As is known, a fractional N-synthesizer has a phase lock loop (PLL) topology that allows for fractional adjustments of the feedback oscillation via a feedback fractional N divider. As is also known, the fractional adjustments of the fractional N divider allow for fine tuning of the local oscillation such that, for example, a particular channel may be tuned, a particular intermediate frequency may be achieved, et cetera.

While a fractional-N synthesizer allows for fine-tuning of a local oscillation, its accuracy is limited by the linearity of the components comprising the fractional-N synthesizer. As is known, the fractional-N synthesizer includes a phase/frequency detector, a charge pump, a low pass or loop filter, a voltage control oscillator, and a fractional-N divider. In most fractional-N synthesizers, the charge pump is a tri-state device providing a positive current when the output oscillation is too low, a negative current when the output oscillation is too high and a zero current at all other times. Thus, when the output oscillation is at its desired rate, the charge pump is primarily providing zero current and, when needed, is providing a relatively small amount of positive current or negative current. To produce the relatively small amount of positive current, the charge pump enables a current source for a short period of time. To produce the relatively small amount of negative current, the charge pump enables a current sink for a short period of time.

Given the current state of the art of integrated circuit fabrication, it is impossible to get the properties (e.g., rise time, settling time, fall time, current magnitude, etc.) of the current source to exactly match the properties of the current sink. As a result of this mismatch, the charge pump does not provide a linear current response over the entire range of regulating the output oscillation. Further, in steady state conditions, the charge pump is primarily operating in the non-linear region due to the minimal amount of positive and negative current needed to maintain the output oscillation and, as a result, produces unwanted spurs in the output oscillation. Such spurs adversely affect the operation of any high performance device incorporating a fractional-N synthesis, including wireless communication devices.

Therefore, a need exists for a linearized oscillation synthesizer, including fractional-N synthesizers, and a method for linearizing an oscillation synthesis, including fractional-N synthesis.

BRIEF SUMMARY OF THE INVENTION

The linearized oscillation synthesis and variations thereof of the present invention substantially meet these needs and others. The linearized oscillation synthesizer, which may be a fractional-N synthesizer, includes a phase and frequency detection module, charge pump circuit, low pass filter, voltage control oscillator, and a feedback module (e.g., fractional-N divider module for the fractional-N synthesizer). The phase and frequency detection module is operably coupled to produce a charge-up signal, a charge-down signal, and an off signal based on phase and/or frequency differences between a reference oscillation and a feedback oscillation. The reference oscillation is generated by a clock source such as a crystal oscillator while the divider module generates the feedback oscillation by dividing the output oscillation by a divider value (e.g., fractional-N value).

The charge pump circuit produces a positive current in response to the charge-up signal, a negative current in response to the charge-down signal and also produces a nonzero offset current. The non-zero offset current shifts the steady state operating condition, and other operating conditions, of the charge pump into a linear region of charge pump performance curve. As such, the adverse effects caused by non-linear operation of the charge pump during steady state condition are substantially eliminated.

The loop filter receives the positive current, negative current and the non-zero offset current to produce a control voltage. The loop filter provides the control voltage to the voltage controlled oscillator, which produces the output oscillation based on the control voltage.

One embodiment of the charge pump circuit includes a gated-up current source module to produce the positive current, a gated-down current source module to produce the negative current and an offset current source to produce the non-zero offset current. The non-zero offset current is of a sufficient value such that, in steady state conditions, the charge pump circuit provides a linear response to the charge-up signal or the charge-down signal. The non-zero offset current may be a positive offset current or a negative offset current. When the non-zero offset current is a positive offset current, the charge pump circuit produces, in steady state conditions, the negative current and the positive offset current thus avoiding the non-linear performance region. Conversely, if the nonzero offset current is a negative offset current, the charge pump circuit provides the positive current and the negative offset current during the stead state conditions.

In other embodiments of the charge pump circuit, the offset current source may be a programmable current source that is programmed based on the fractional component of the fractional-N divider value. This allows for tuning of the reference spurs that result from the fractional portion of the divider value times the reference oscillation.

The reference spurs may be further reduced by gating the offset current source to produce a gated offset current. The gating is done based on the reference oscillation and is aligned, in time, to minimize the ripple on the control voltage. One embodiment of the gated current offset module includes a current source, a switch, and a control module. The current source cyclically sinks current from the loop filter when the switch is activated based on the switch being activated in accordance with a gate control signal. The control module generates the gate control signal based on the reference oscillation and a predetermined duty cycle of the reference clock such that the gate offset current is time aligned with the positive current.

An alternate embodiment of the gated offset current module includes a current source, a switch and a control module. The current source cyclically sources currents to the loop filter when the switch is activated based on the switch being activated in accordance with a gate control signal. The control module generates the gate control signal based on the reference oscillation and a predetermined duty cycle of the reference oscillation such that the gated offset current is aligned with the negative current.

The various embodiments of the fractional-N synthesizer, or oscillation synthesizer, may be used in a local oscillation module of a radio receiver and/or radio transmitter. By utilizing the linear fractional-N synthesizer in a radio transmitter or radio receiver, the overall performance of the radio receiver and/or transmitter is enhanced since the spurs produced by non-linear performance of previous fractional-N synthesizers is substantially eliminated and noise is reduced.

BRIEF DESCRIPTION OF THE SEVERAL VIEWS OF THE DRAWINGS

FIG. 8 is a graphical representation comparing a non-steady state performance of a prior art fractional-N synthesizer with a fractional-N synthesizer in accordance with the present invention when the output oscillation is too slow;

FIG. 9 is a graphical representation comparing steady state performance of a prior art fractional-N synthesizer with a fractional-N synthesizer in accordance with the present invention;

FIG. 16 is a logic diagram of a method for linearizing an oscillation synthesizer in accordance with the present invention; and FIG. 17 is a logic diagram of an alternate method for linearizing an oscillation synthesizer in accordance with the present invention.

DETAILED DESCRIPTION OF THE INVENTION

Figure 1:
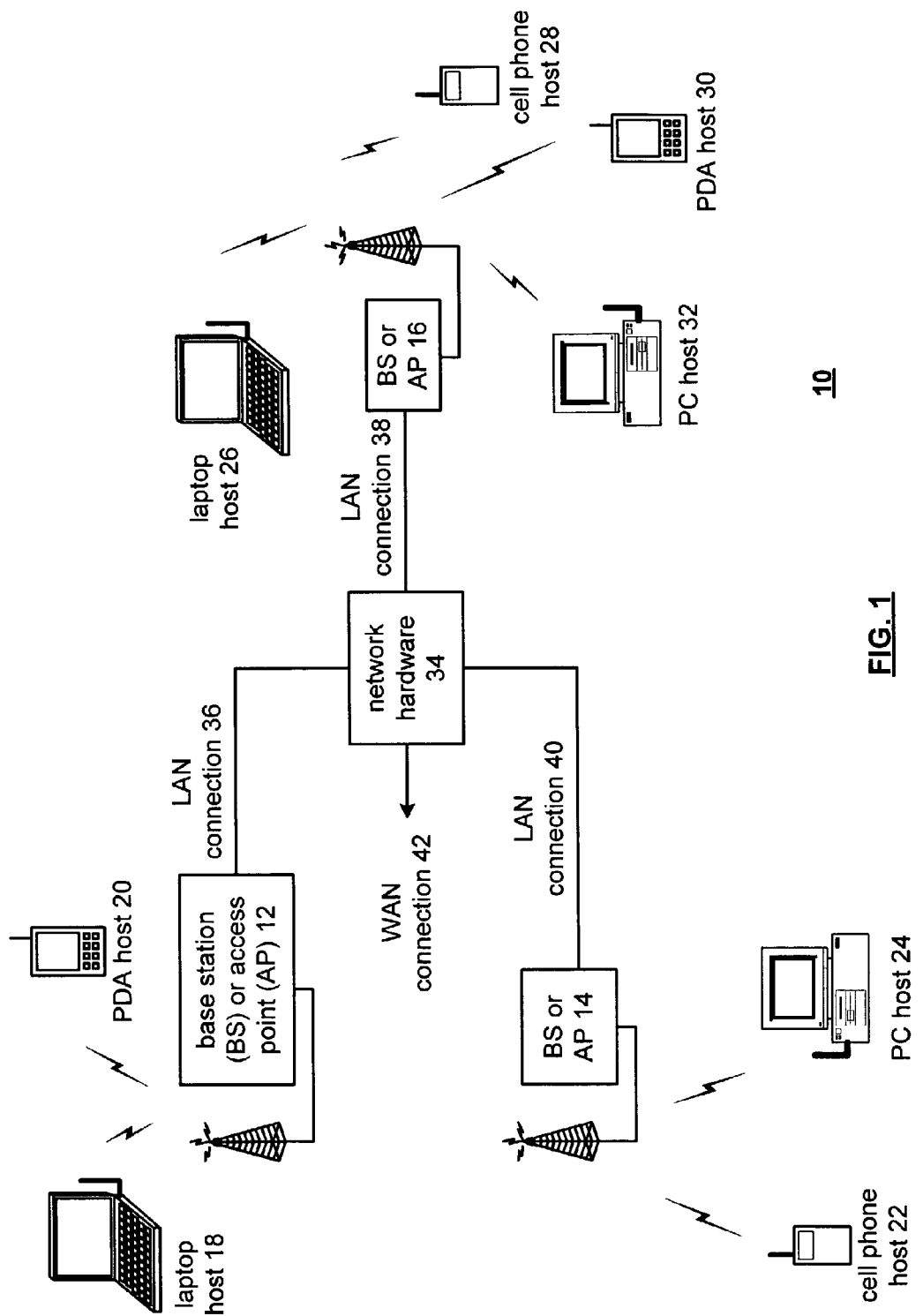
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
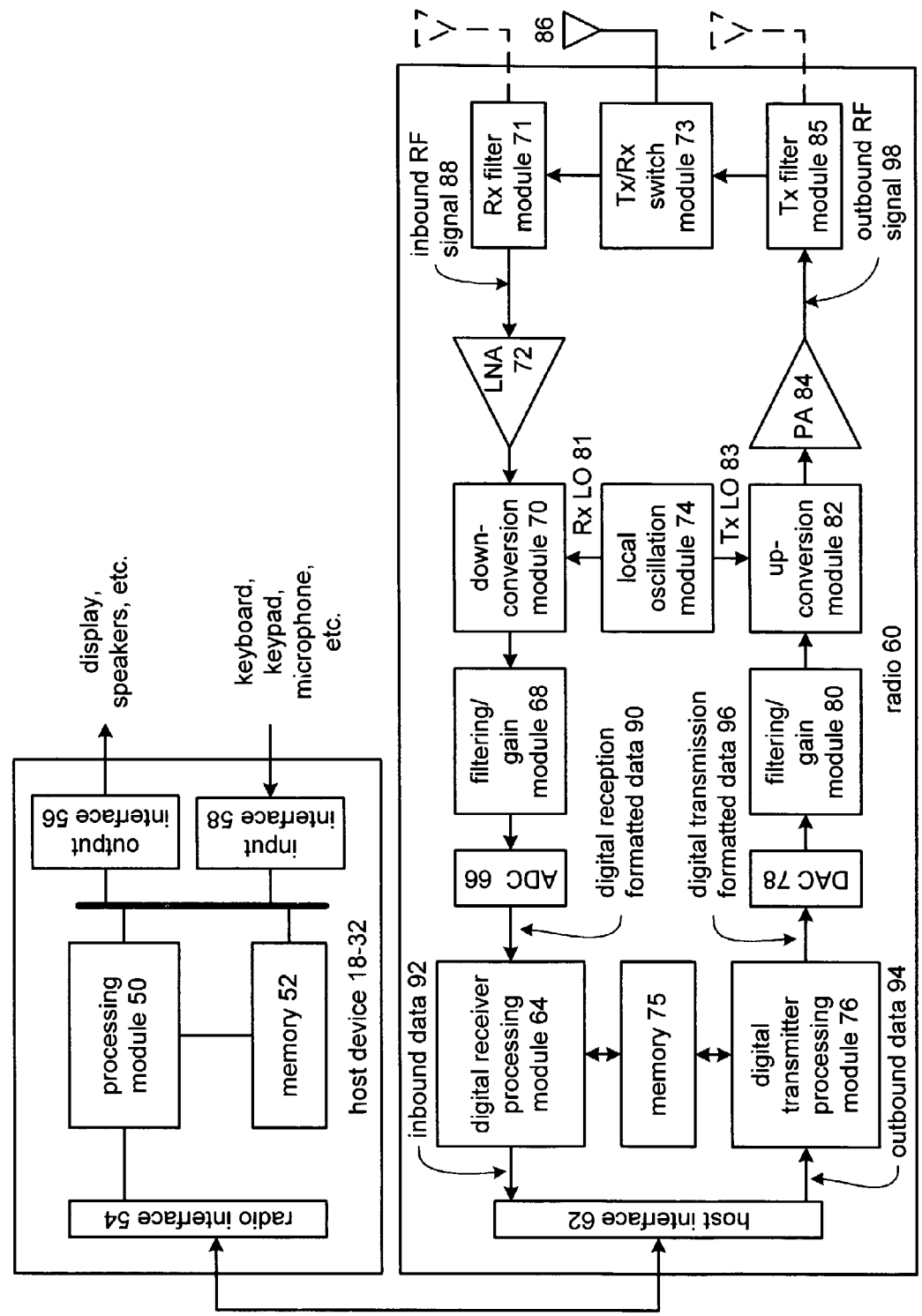
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
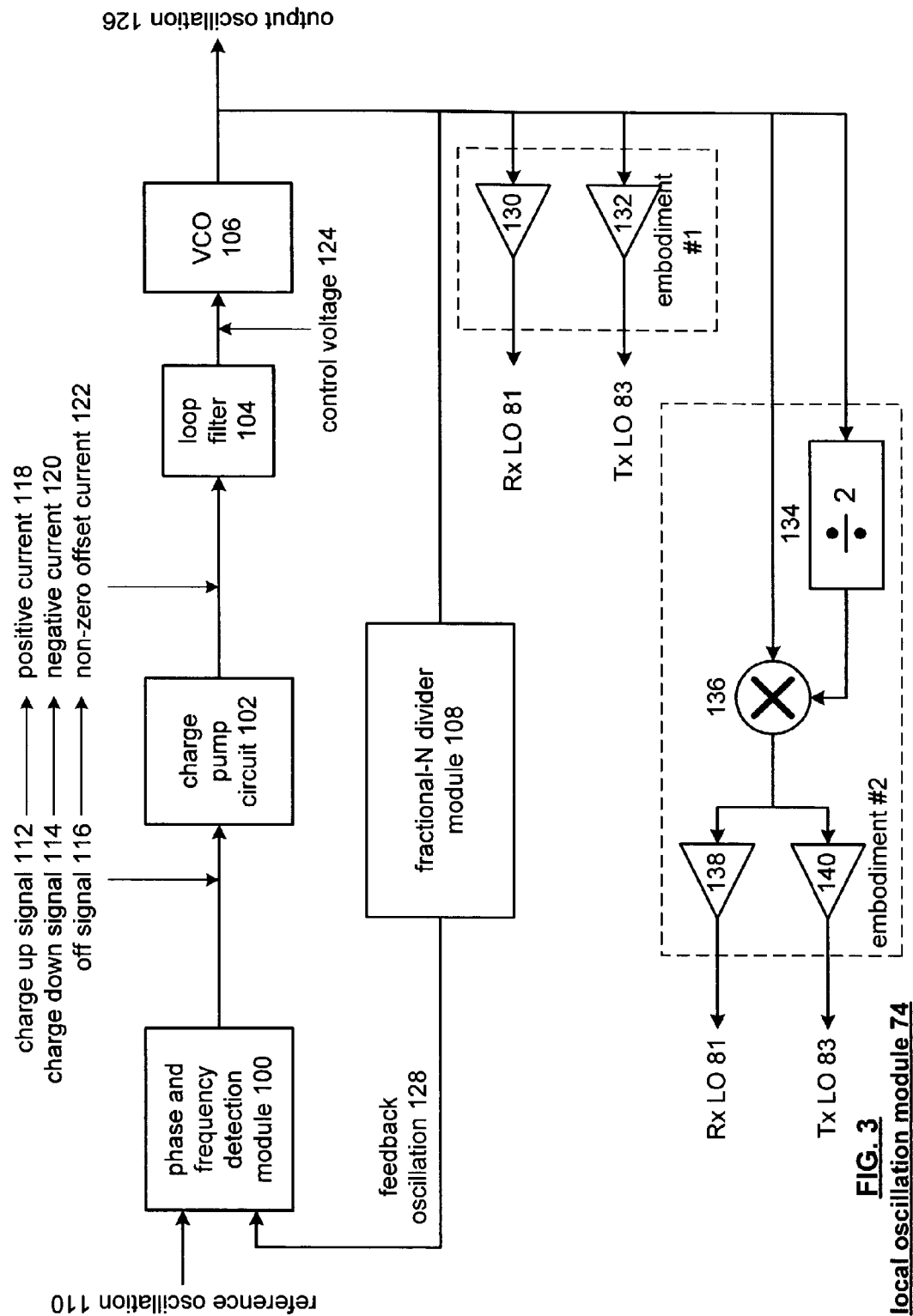
FIG. 3 is a schematic block diagram of a local oscillation module in accordance with the present invention.

FIG. 3 illustrates an embodiment of the local oscillation module 74 that includes a phase and frequency detection module 100, a charge pump circuit 102, a loop filter 104, a voltage controlled oscillator (VCO) 106, and a fractional-N divider module 108. The receiver local oscillation 81 and the transmitter local oscillation 83 may be generated from the output oscillation 128 in a variety of embodiments. In one embodiment, the receiver local oscillation 81 and the transmitter local oscillation 83 are directly produced from the output oscillation 126 via buffers 130 and 132. As one of average skill in the art will appreciate, an I and Q component for the receiver local oscillation 81 and the transmitter local oscillation 83 may be obtained by phase shifting the I components of the local oscillations 81 and 83 by 90°.

In an alternate embodiment, the receiver local oscillation 81 and transmitter local oscillation 83 may be produced by a plurality of logic gates. As shown, the output oscillation 126 may be divided via a divide by 2 module 134 and then multiplied via multiplier 136. The resulting oscillation from multiplier 136 has a frequency that is 1½ times the output oscillation 126. From this increased oscillation the receiver local oscillation 81 and transmitter local oscillation 83 are derived via buffers 138 and 140. As one of average skill in the art will appreciate, the output oscillation 126 may be phase shifted by 90° and the logic circuitry repeated to produce a Q component for the receiver local oscillation 81 and a Q component for the transmit local oscillation 83.

The phase and frequency detection module 100 is operably coupled to receive a reference oscillation 110 and a feedback oscillation 128. The reference oscillation 110 may be produced by a crystal oscillator and/or another type of clock source. The phase and frequency detection module 100 produces a charge-up signal 112 when the phase and/or frequency of the feedback oscillation 128 lags the phase and/or frequency of the reference oscillation 110. In this condition, the output oscillation 126 is at a frequency below its desired rate. The phase and frequency detection module 100 generates the charge down signal 114 when the phase and/or frequency of the feedback oscillation 128 leads the phase and/or frequency of the reference oscillation 110. In this condition, the output oscillation 126 is above its desired rate. The phase and frequency detection module 100 produces the off signal 116 when the phase and/or frequency of the feedback oscillation 128 is aligned with the phase and/or frequency of the reference oscillation 110. In addition, the phase and/or frequency detection module 100 produces the off signal 116 when not producing the charge-up signal or charge-down signal. This concept will be described in greater detail with reference to FIGS. 8 and 9.

The charge pump circuit 102, which will be described in greater detail in FIGS. 4–7, receives the charge-up signal 112, the charge-down signal 114 and the off signal 116. In response to the charge-up signal 112, the charge pump 102 produces a positive current 118, in response to the charge-down signal 114, the charge pump circuit 102 produces a negative current 120. Regardless of the charge-up signal 112, charge-down signal 114 or off signal 116, the charge pump 102 produces a non-zero offset current 122. Thus, when off signal 116 is present, the charge pump circuit 102 is producing the nonzero offset current 122. Further, when the charge pump circuit 102 produces the positive current 118 and the negative current 120 these currents are added to or subtracted from the non-zero offset current 122.

With the charge pump circuit 102 producing the non-zero offset current 122, the steady state condition of the local oscillation module 74, which may be implemented as a fractional-N synthesizer, is shifted from the non-linear region of the charge pump 102 into a linear region. With the charge pump operating in its linear region, the overall performance of the local oscillation module 74 is enhanced since the adverse spurs produced by non-linearities in the charge pump circuit 102 are substantially eliminated and noise is reduced.

The loop filter 104 receives the positive current 118, negative current 120 and non-zero offset current 122 and produces therefrom a control voltage 124. The loop filter 104 provides the control voltage 124 to the voltage control oscillator 106. The voltage control oscillator 106 generates the output oscillation 126 based on the control voltage 124.

The fractional-N divider module 108, divides the output oscillation 126 by a fractional-N divider value to produce the feedback oscillation 128. The fractional-N divider module 108 will be described in greater detail with reference to FIG. 10 but in general includes a Delta Sigma modulator, register and summing module. The Delta Sigma modulator is operably coupled to generate an over sampled digital data stream that represents a fractional component of the fractional-N value. The register stores an integer component of the fractional-N value while the summing module sums the over sampled digital data stream with the integer component to produce the fractional-N value. The Delta Sigma modulator may be a $3^{rd}$ order mash Delta Sigma modulator.

Figure 4:
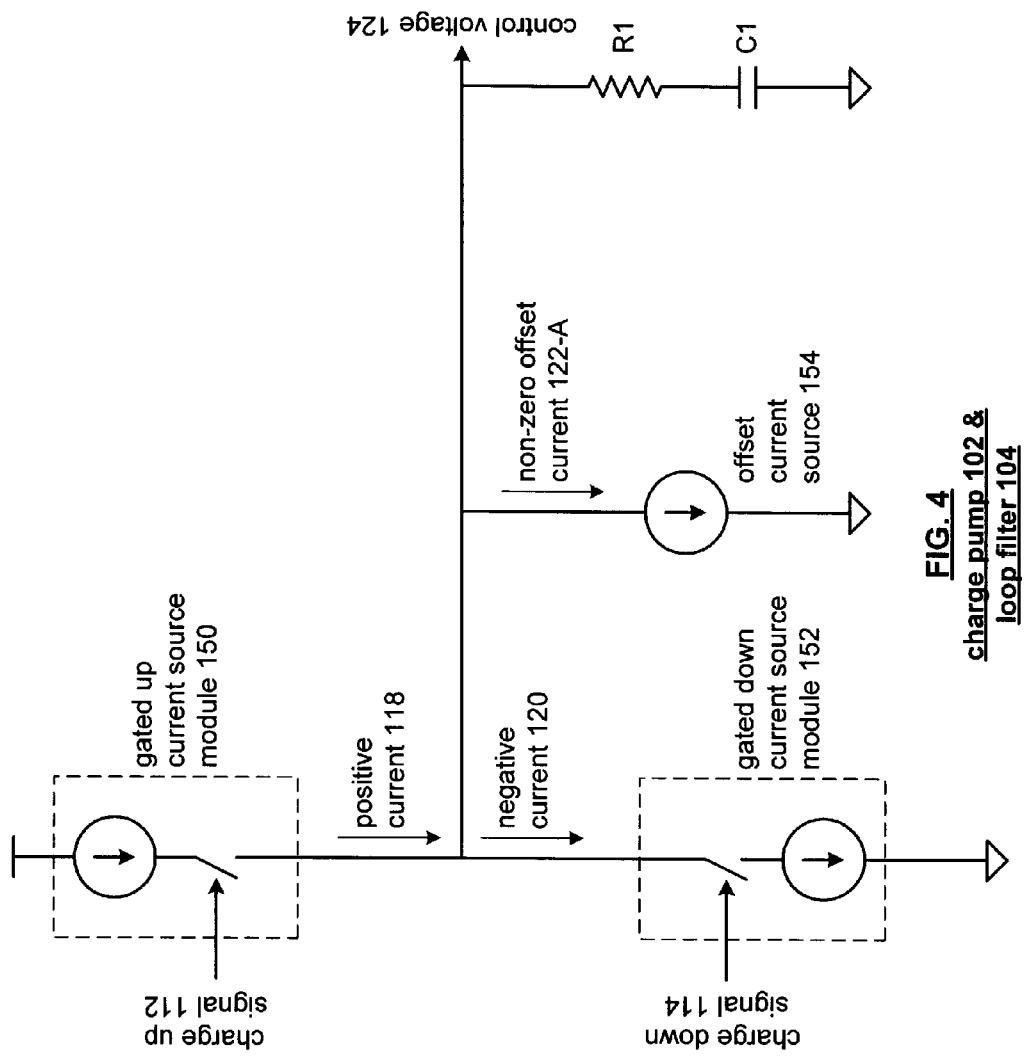
FIG. 4 is a schematic block diagram of a charge pump and loop filter in accordance with the present invention.

FIG. 4 illustrates a schematic block diagram of one embodiment of charge pump 102 and of loop filter 104. The loop filter 104 includes resistor R1 and capacitor C1. The remaining components, the gated-up current source module 150, the gated-down current source module 152 and the offset current source 154 comprise the charge pump 102. In this embodiment, the offset current source 154, which may be a fixed current source or a programmable current source, is constantly sinking a non-zero negative offset current 122-A from the loop filter. The non-zero negative offset current 122-A is generated regardless of whether the charge-up signal 112, the charge-down signal 114 or the off signal 116 is being generated.

When the charge pump 102 receives the charge-up signal 112, the switch within the gated-up current source module 150 is closed thus, enabling the current source to provide positive current 118. Similarly, when the charge-down signal 114 is received, the switch in the gated-down current source module 152 is closed thus, allowing the associated current sink to provide the negative current 120. The effects of the non-zero negative offset current 122-A will be described in greater detail with reference to FIGS. 6 and 7.

Figure 5:
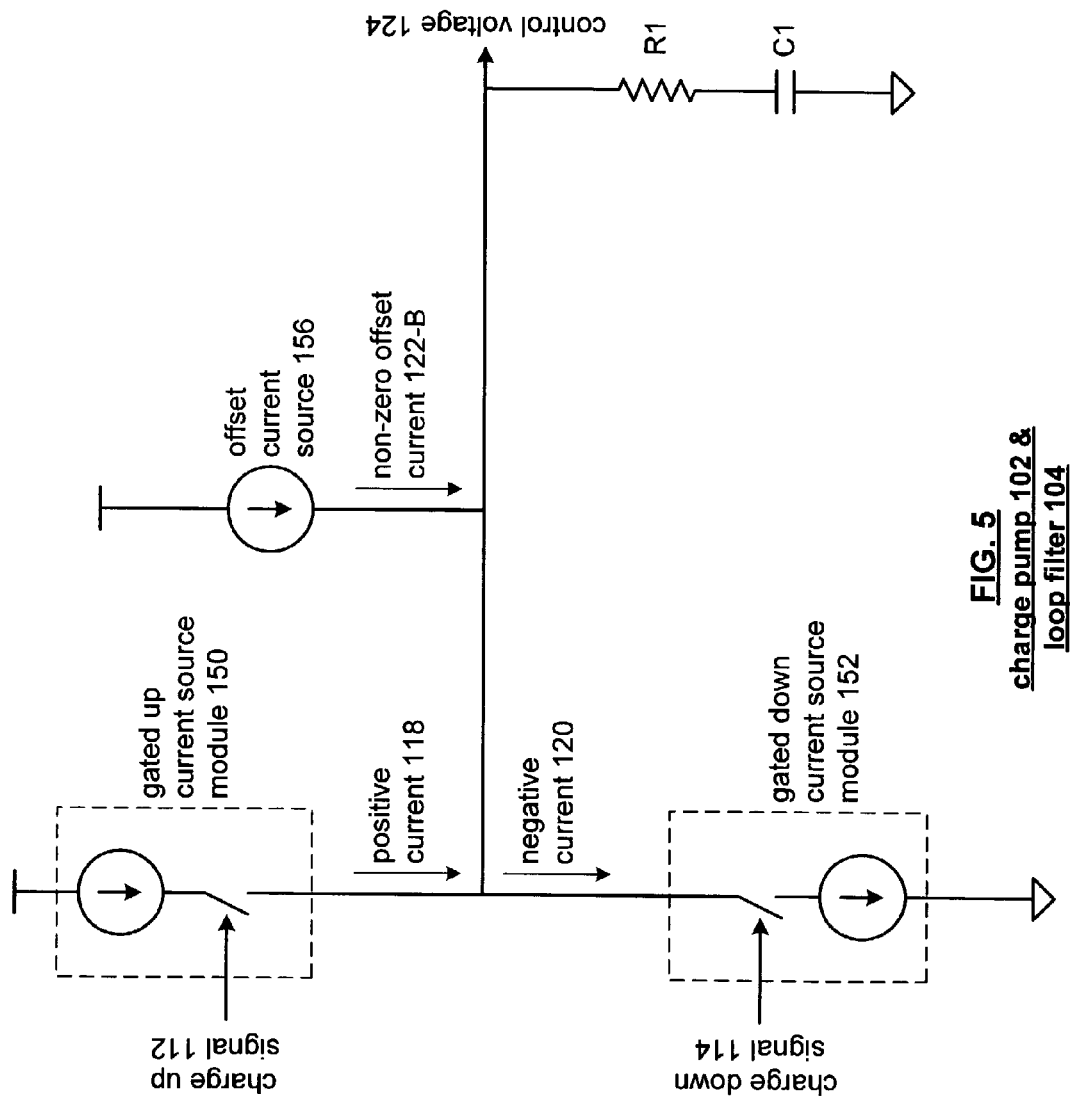
FIG. 5 is a schematic block diagram of an alternate charge pump and loop filter in accordance with the present invention.

FIG. 5 illustrates an alternate schematic block diagram of charge pump 102 and loop filter 104. Loop filter 104 again includes resistor RI and Cl. The charge pump 102 includes the gated-up current source module 150, the gated-down current source module 152 and offset current source 156. In this embodiment, the offset current source 156 is continually providing a non-zero positive offset current 122-B. The gated-up current source module 150 and gated-down current source module 152 operate as previously discussed to produce the positive current 118 and the negative current 120. The effects of providing the non-zero positive offset current 122-B will be discussed in greater detail with reference to FIGS. 6 and 7.

Figure 6:
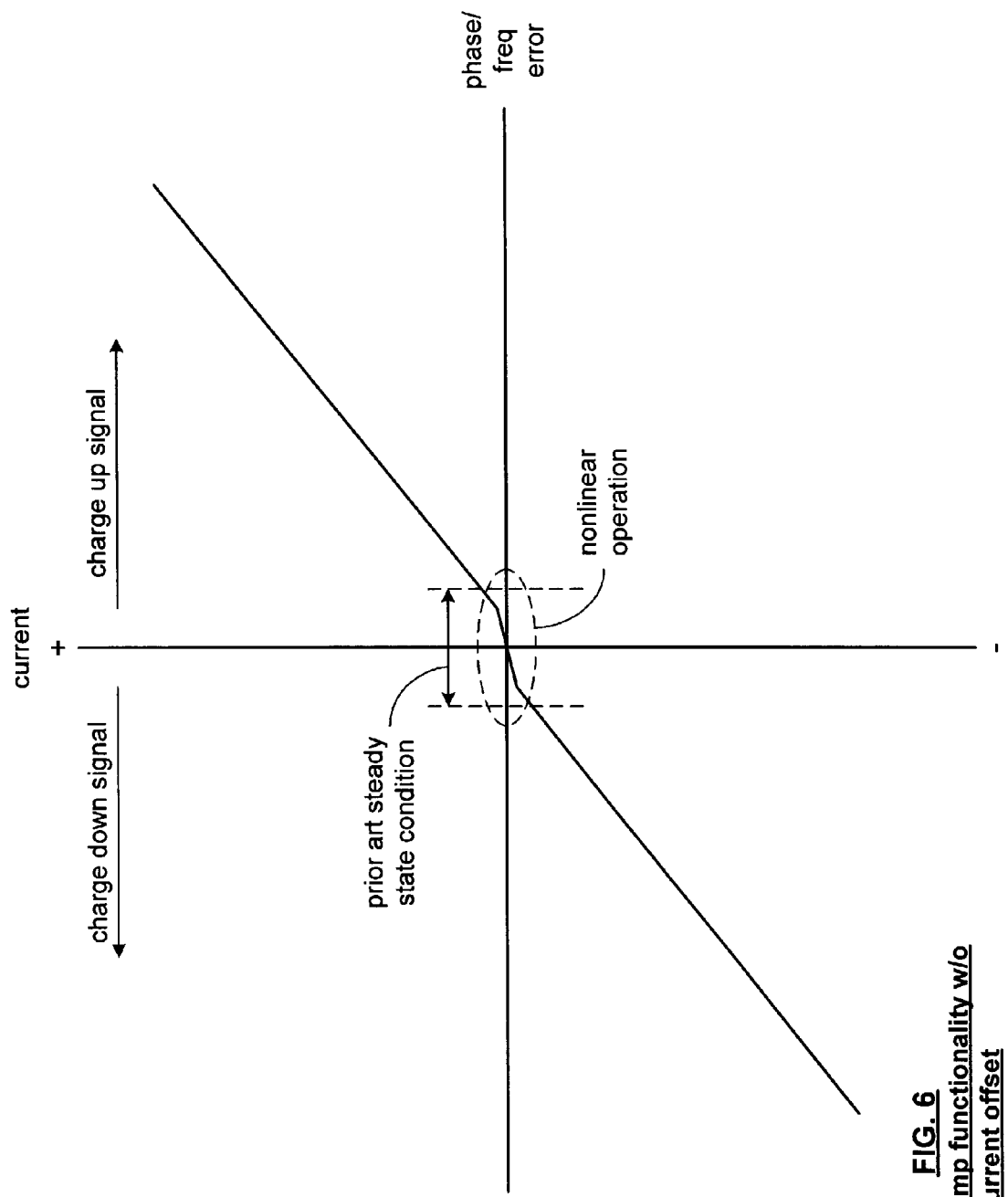
FIG. 6 is a graphical representation of non-linear performance of a charge pump circuit that does not incorporate the teachings of the present invention.

FIG. 6 illustrates a graph of the charge-pump response without a current offset module. As shown, the current produced by the charge pump is plotted against the phase/frequency error. The phase/frequency error corresponds to the phase and/or frequency difference between the reference oscillation and the feedback oscillation. Accordingly, the greater the phase and/or frequency difference the larger the duration of the charge-up or charge-down signal will be. As shown, as the phase and/or frequency error deviates from the origin, the charge-up signal increases to the right and the charge-down signal increases to the left. Correspondingly, the positive current increases as the charge-up signal increases and the negative current increases as the charge-down signal increases.

In the steady state condition for a charge pump without a current offset, the charge-down signal and charge-up signal are relatively small. As such, the positive or negative currents produced are relatively small. As shown, in the region around the origin, the performance of the charge pump is non-linear. Since the charge pump typically operates in this small region during steady state conditions, the charge pump is non-linear. As previously mentioned, non-linear performance of the charge pump produces undesired spurs in the output oscillation and noise, which adversely affect devices incorporating a fractional-N synthesizer.

Figure 7:
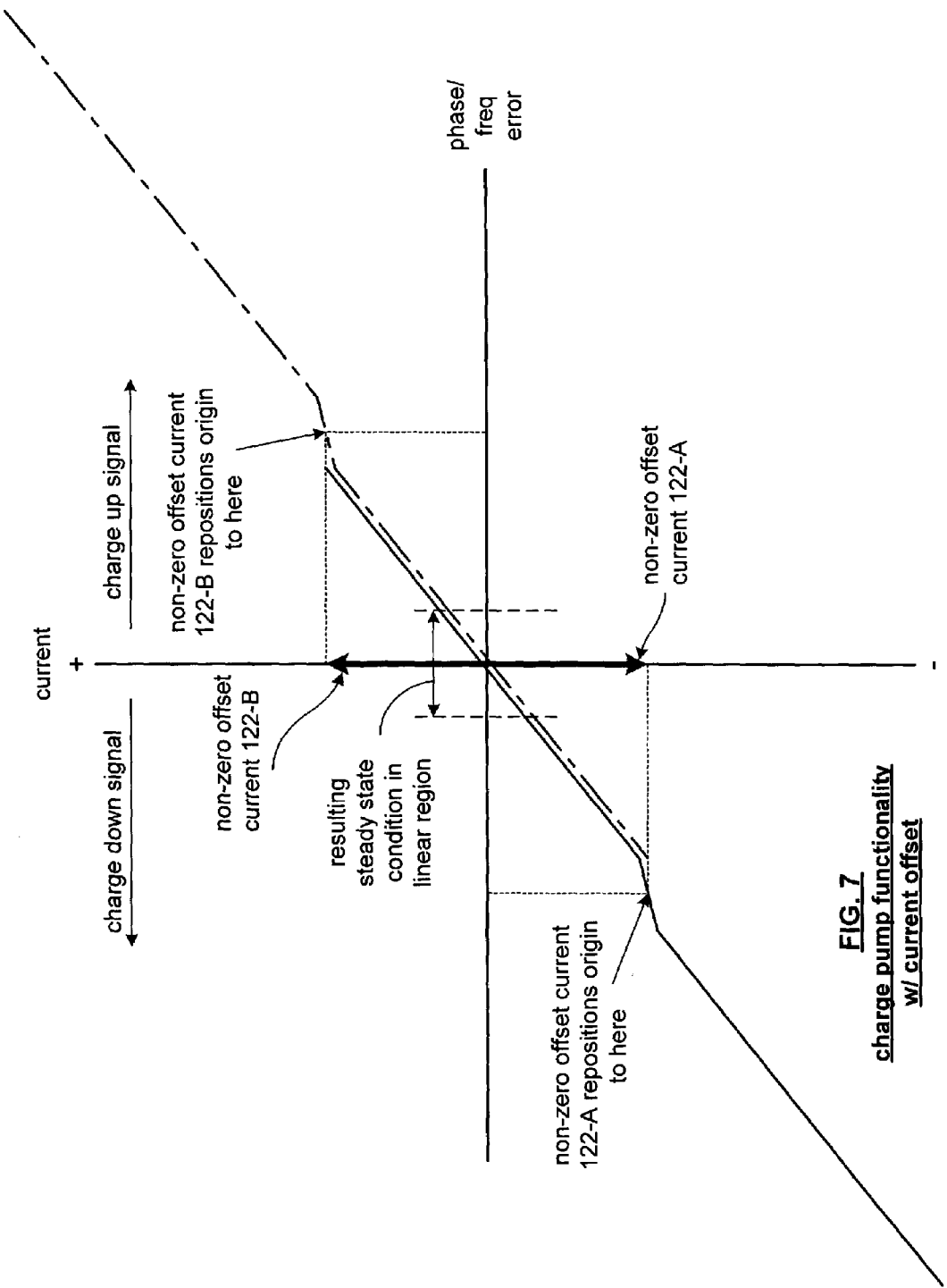
FIG. 7 is a graphical representation of a charge pump's linear performance in accordance with the present invention.

FIG. 7 illustrates a graph that plots the performance of a charge pump in accordance with the present invention illustrated in FIGS. 4 and 5. The charge pump illustrated in FIG. 4 produces the non-zero negative offset current 122-A via the offset current source 154. The non-zero negative offset current 122-A is shown along the current axis and in the negative direction. This offsets the charge pump performance curve such that the origin of is repositioned to a point corresponding to the offset current 122-A. Thus, for steady state operation of the fractional-N synthesizer, the current versus phase/frequency error curve of the charge pump is operating in a linear region. By operating in the linear region of the curve, the spurs and noise produced by non-linear operation are substantially eliminated. By avoiding the production of non-desired spurs in the output oscillation, the fractional-N synthesizer performs better and hence devices incorporating the fractional-N synthesizer perform better.

The embodiment of the charge pump 102 illustrated in FIG. 5 produces the nonzero positive offset current 122-B. As shown in FIG. 7, the production of non-zero positive offset current 122-B shifts the plot of the current versus phase/frequency error curve of the charge pump to the position as indicated. As such, when the fractional-N synthesizer is in a steady state condition, the charge pump is operating within its linear region.

FIG. 8 illustrates the affects on the charge-up and charge-down signals with the inclusion of a negative offset current in comparison to prior art embodiments. At the top of FIG. 8, one pulse of reference oscillation 110 is depicted. With respect to a prior art fractional-N synthesizer, one pulse of the feedback oscillation is also shown. The prior art feedback oscillation is shown to be trailing the reference oscillation 110 indicating that the output oscillation 126 is too slow.

As a result of the offset current, in the fractional-N synthesizers in accordance with the present invention, the feedback oscillation 128 is further phase shifted with respect to the reference oscillation 110. The additional phase shift is due to the offset current.

The next signal corresponds to the prior art charge-up signal. As is known, the prior art charge-up signal is active high when the reference oscillation 110 is high and the prior art feedback oscillation is low. The prior art charge-down signal is briefly toggled based on the rising edge of the prior art feedback oscillation. When both the charge-up signal and charge-down signal are high, both signals are reset providing the off signal 116, which remains until the next period of the reference oscillation 110 and feedback oscillation.

Charge-up signal 112, in accordance with the present invention is on for a longer duration than the prior art charge-up signal due to the phase shifting caused by the offset current. The charge-down signal 114 is still activated on the leading edge of the feedback oscillation 128 and, when both the charge-up signal 112 and charge-down signal 114 high, they are subsequently reset. The resulting signal is the off signal 116, which remains until the next phase of the frequency reference oscillation 110 and feedback oscillation 128.

As one of average skill in the art will appreciate, if the output oscillation 126 is too fast, the relationship between the charge-up signal 112 and charge-down signal 114 is reversed. As such, the charge-down signal 114 is activated 1$^{st}$ and on for a duration where the charge-up signal 112 is activated just long enough to reset both signals. As one of average skill in the art will further appreciate, if a positive offset current is used in the charge pump circuit, the charge down signal is of a longer duration and shifted to the left, with respect to the illustration of FIG. 8.

FIG. 9 illustrates a timing diagram of a pulse of the reference oscillation, feedback oscillation of the prior art, feedback oscillation 128 of the charge pumps of FIGS. 4 and 5, the prior art charge-up, the prior art charge-down signal, the charge up signal 112, and the charge down signal 114. As shown, in the top portion of FIG. 9, the reference oscillation 110 transitions from low to high substantially at the same time that the prior art feedback oscillations transitions from low to high. As such, the corresponding prior art charge-up signal and prior art charge-down signal transition low to high for a very short duration. Due to the imperfections between the charge-up current source and the charge-down current source, one signal will be activated slightly longer than the other producing a current imbalance. This current imbalance causes the nonlinearity illustrated in FIG. 6.

In contrast, by producing a phase shift due to the offset current, the charge-up signal 112 will be high for a relatively significant duration in comparison to the prior art charge-up signal. As such, this shifts the operating point into the linear region of the charge pump. This was illustrated in FIG. 7.

Figure 10:
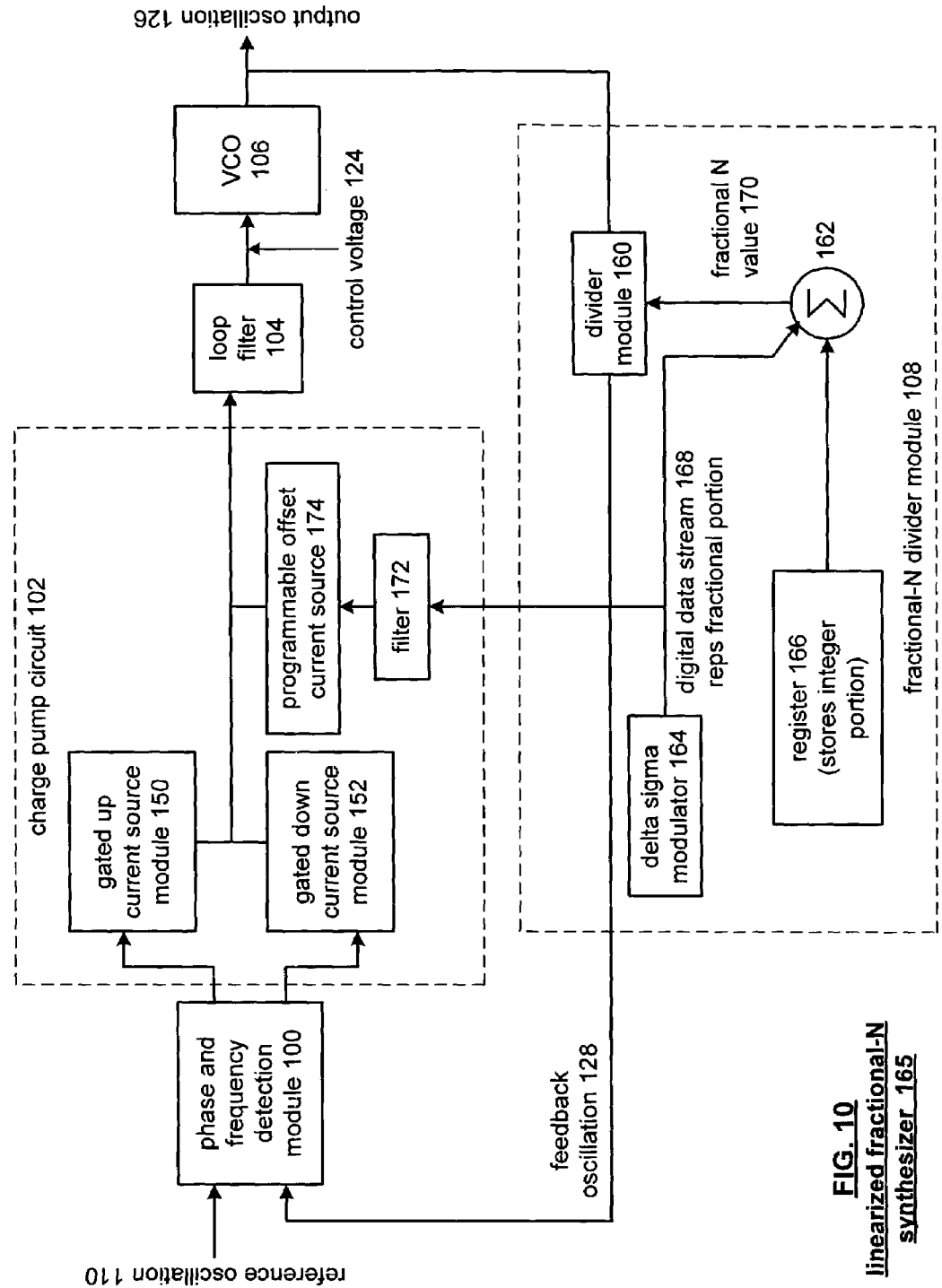
FIG. 10 is a schematic block diagram of a linearized fractional-N synthesizer in accordance with the present invention.

FIG. 10 illustrates a schematic block diagram of a linearized fractional-N synthesizer that may be used in the local oscillation module 74. The linearized fractional-N synthesizer includes the phase and frequency detection module 100, charge pump circuit 102, loop filter 104, VCO 106, and the fractional-N divider module 108. The charge pump circuit 102 includes a gated-up current source module 150, gated-down current source module 152, programmable offset current source 174 and filter 172. The fractional-N divider module 108 includes a divider module 160, a summing module 162, a Delta Sigma modulator 164 and a register 166.

The fractional-N divider module 108 functions to divide the output oscillation 126 by a fractional-N divider value 170 via the divider module 160, to produce the feedback oscillation 128. To produce the fractional-N divider value 170, register 166 stores the integer portion of the fractional-N divider value 170. To produce the fractional portion of the fractional-N divider value 170, the Delta Sigma modulator 164 is modulated based on the desired fractional value to produce a digital stream of data 168, which represents the fractional portion. The summing module 162 sums the integer portion with the digital data stream 168 to produce the fractional-N value 170. Divider module 160, based on the fractional-N divider value 170, produces the feedback oscillation 128 from the output oscillation 126.

The charge pump circuit 102 functions similarly to the charge pump circuits discussed with reference to FIGS. 4 and 5. In this embodiment, however, the offset current source is a programmable current source 174. The corresponding offset current is based on a filtered representation of the digital data stream 168 via filter 172. By programming the offset current source based on the fractional portion, magnitude of reference oscillation spurs are reduced. As is known, fractional spurs are produced based on the reference oscillation times the fractional portion of the divider value and are different from the spurs produced by non-linearities of the charge pump. If the divider value is relatively small (e.g., 0.01) and the reference oscillation is 20 megahertz, the fractional spurs will be produced at + and −20 kilohertz with respect to the output oscillation 128. To minimize the magnitude of the fractional spurs, the offset current produced by the programmable offset current source 174 is of minimal value to shift the charge pump operation into the linear region but to minimize the magnitude of the reference spurs.

The performance of the phase and frequency detection module 100, loop filter 104 and voltage control oscillator 106 are as previously described. As one of average skill in the art will appreciate, the output oscillation 126 may be used to directly produce the transmit and receive local oscillations 81 and 83 or may be further processed by logic circuitry to produce the transmit and receive local oscillations 81 and 83.

Figure 11:
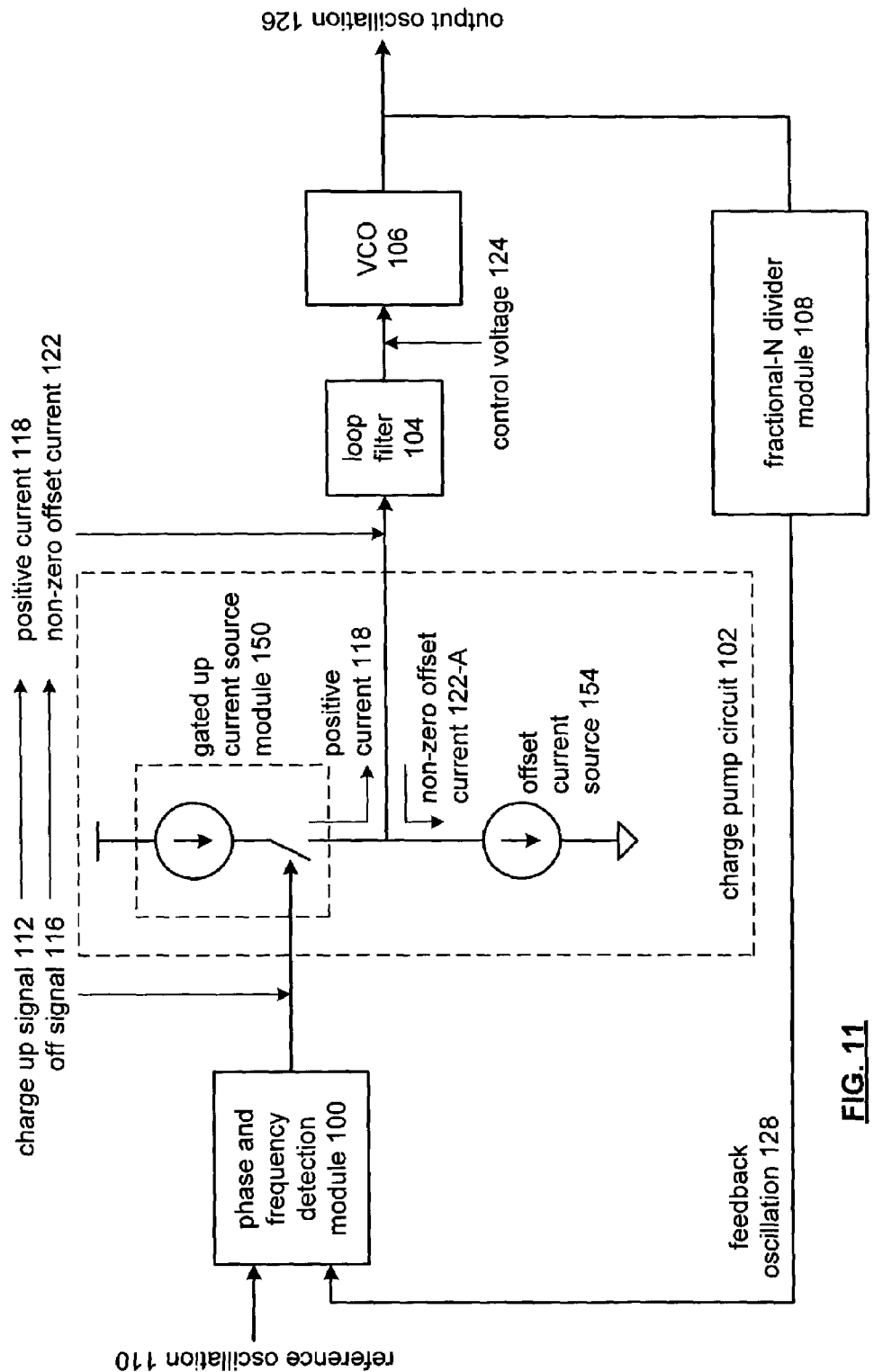
FIG. 11 is a schematic block diagram of an alternate linear fractional-N synthesizer in accordance with the present invention.

FIG. 11 illustrates an alternate schematic block diagram of a fractional-N synthesizer 180 that may be used in local oscillation module 74. In this embodiment of the fractional-N synthesizer 180, it includes the phase and frequency detection module 100, the charge pump current 102, loop filter 104, VCO 106 and fractional-N divider module 108. In this embodiment, the charge pump circuit 102 includes the gated-up current source module 150 and the offset current source 154. With the addition of the offset current source 154, in steady state conditions, the phase and frequency detection module 100 will only produce the charge-up signal 112. As such, the charge pump circuit 102, in this embodiment, has omitted the gated-down current source module 152. In this embodiment, the fractional-N synthesizer 180 will have a slightly slower loop response with respect to decreases in the output oscillation in comparison to the fractional-N synthesizer illustrated in FIG. 3 or FIG. 10.

Figure 12:
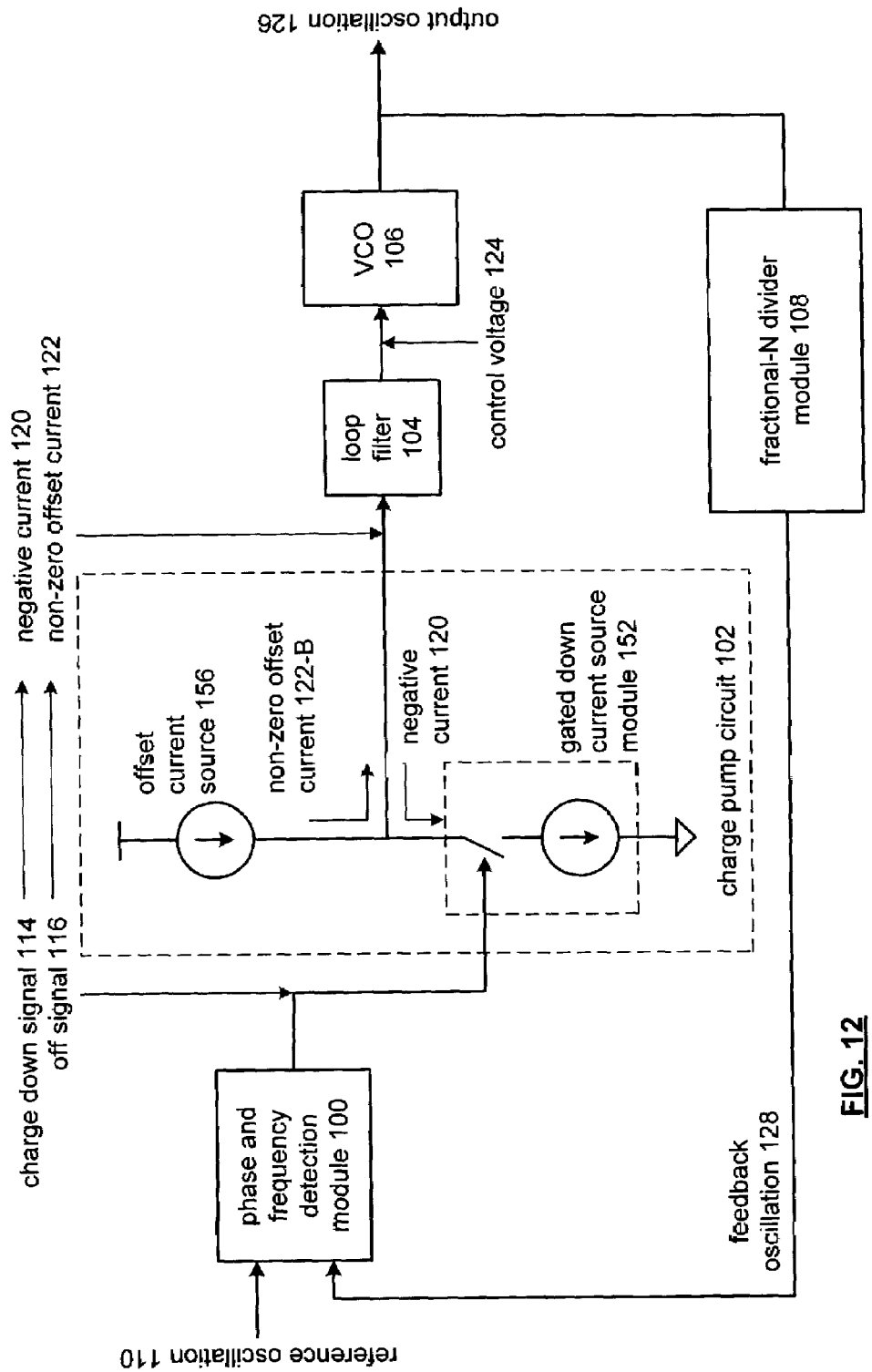
FIG. 12 is a schematic block diagram of another linearized fractional-N synthesizer in accordance with the present invention.

FIG. 12 illustrates an alternate schematic block diagram of a fractional-N synthesizer 190 that may be used in the local oscillation module 74. In this embodiment, the fractional-N synthesizer 190 includes the phase and frequency detection module 100, charge pump circuit 102, loop filter 104, VCO 106, and fractional-N divider module 108. In this embodiment, the charge pump circuit 102 includes the offset current source 156 that produces the non-zero offset current 122-B and the gated-down current source module 152. With the inclusion of the offset current source 156, the phase and frequency detection module 100 during steady state conditions will only produce a charge-down signal 114. As such, the gated-up current source module 150 may be omitted in this embodiment. In this embodiment, however, the loop response to increases and output frequency oscillation 126 is slightly less than that of the fractional-N synthesizers illustrated in FIGS. 3 and 10.

Figure 13:
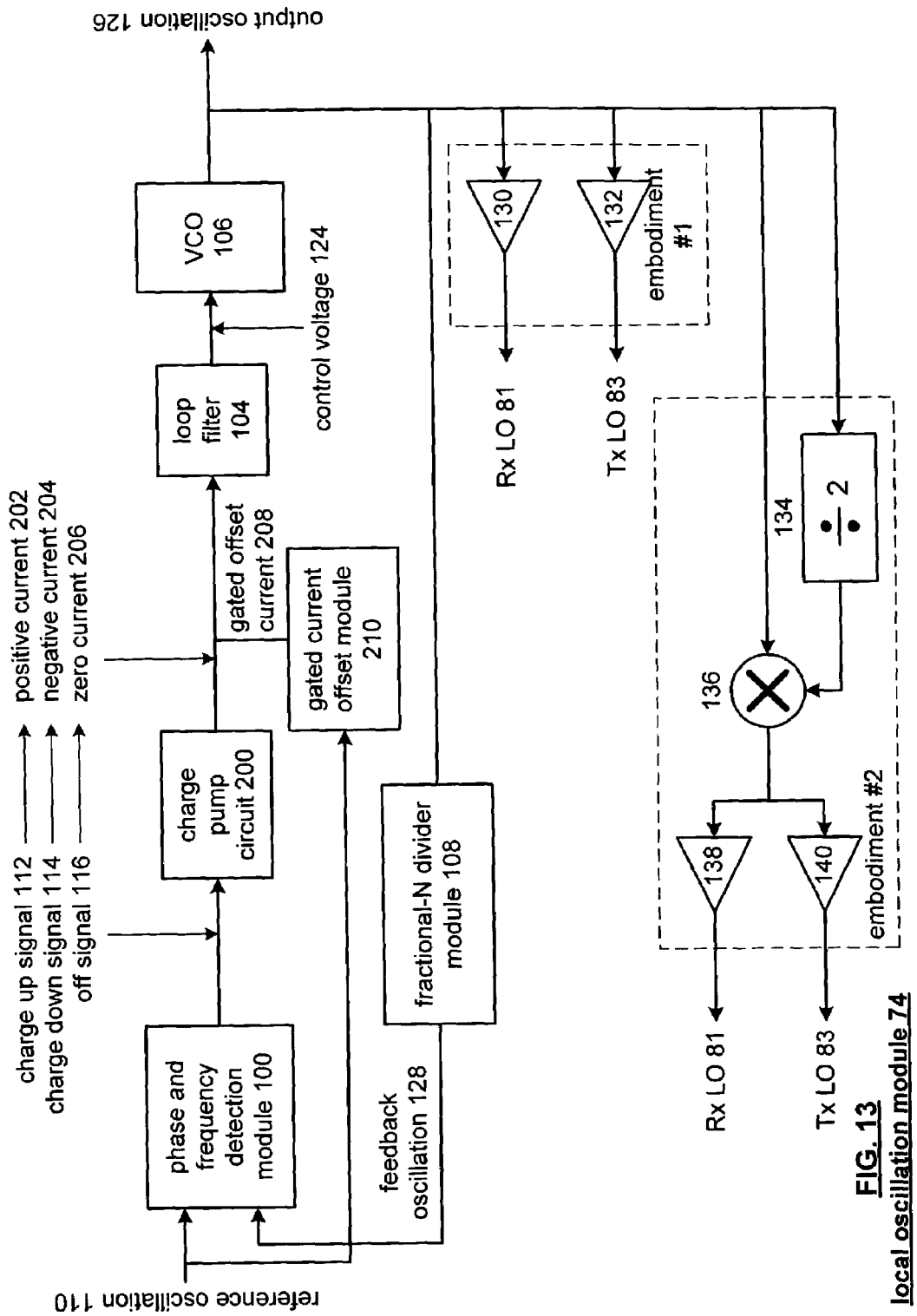
FIG. 13 is a schematic block diagram illustrating an alternate embodiment of a local oscillation module in accordance with the present invention.

FIG. 13 illustrates a schematic block diagram of local oscillation module 74 that includes the phase and frequency detection module 100, a charge pump circuit 200, a gated current offset module 210, loop filter 104, VCO 106, and fractional-N divider modules 108. The receiver local oscillation 81 and transmitter local oscillation 83 may be derived from the output oscillation 126 as shown in embodiments 1 or embodiments 2. Embodiments 1 and 2 were previously discussed with reference to FIG. 3.

In operation, the phase and frequency detection module 100 produces the charge-up signal 112, charge-down signal 114 and off signal 116 in response to phase and/or frequency differences between the reference oscillation 110 and feedback oscillation 128. The charge pump circuit 200 produces a positive current 202 in response to the charge-up signal 112, produces a negative current 204 in response to the charge-down signal 114, and produces a zero current 206 in response to the off signal 116.

The gated current offset module 210 provides a gated offset current 208 based on the reference oscillation 110. The current produced by the charge pump circuit 200 and gated offset current 208 are provided to loop filter 104, which produces therefrom the control voltage 124.

The gated current offset module 210 produces the gated offset current 208 to shift the response of the charge pump circuit as illustrated in FIG. 7. However, in comparison to the previously discussed charge pump circuits, which have a continual offset current, the offset current provided by the gated current offset module 210 is a non-continuous current.

Figure 14:
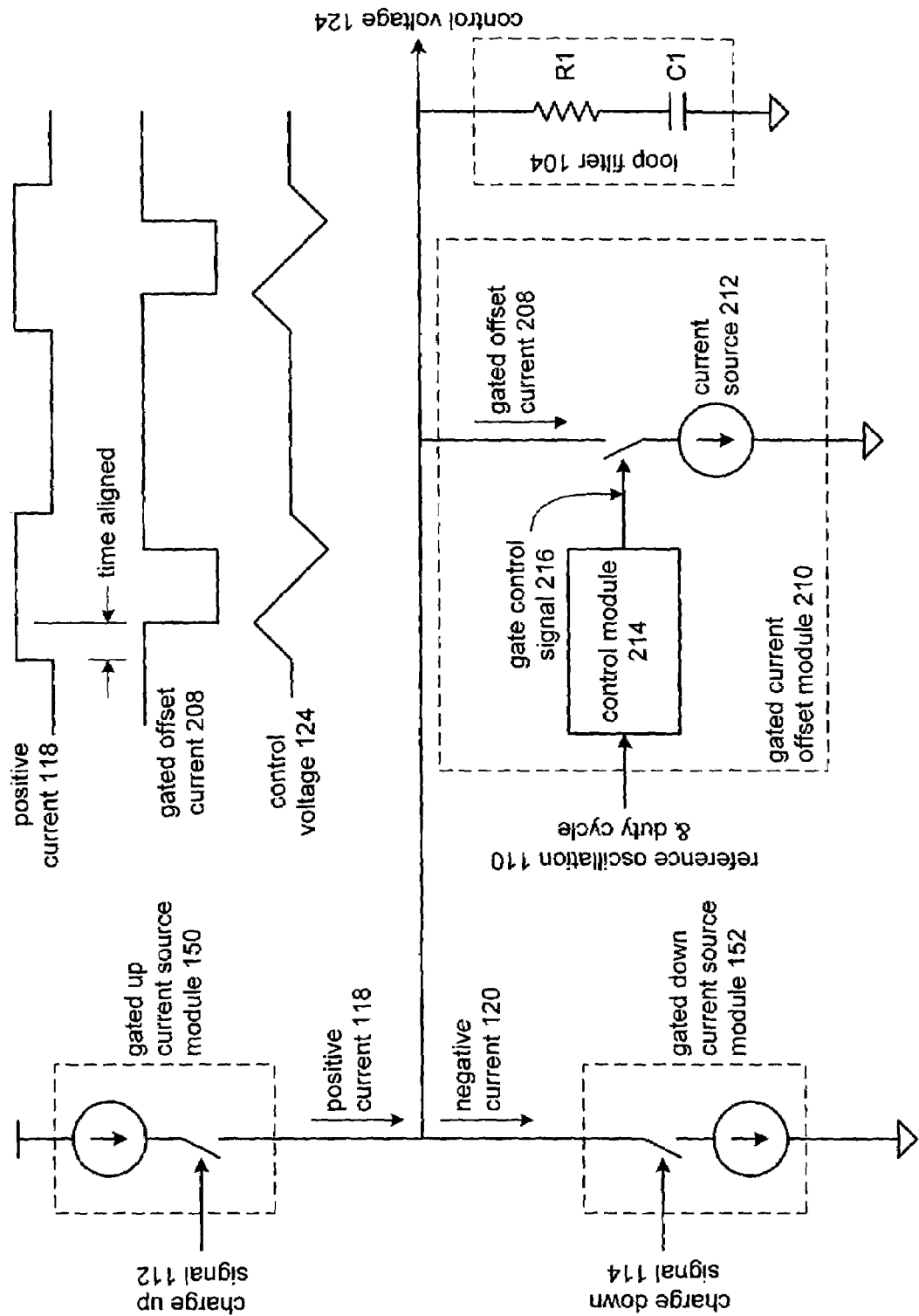
FIG. 14 is a schematic block diagram further illustrating components of the local oscillation module of FIG. 13.

FIG. 14 illustrates the charge pump 200, gated current offset module 210 and loop filter 104 of FIG. 13 in greater detail. The charge pump circuit 200 includes the gated-up current source module 150 and the gated-down current source module 152. Accordingly, the gated-up current source module 150 produces the positive current 118 in response to the charge-up signal 112. The gated-down current source module 152 produces the negative current 120 based on the charge down signal 114. The gated-down current source module 152 and the gated-up current source module 150 are either both on or both off to produce the zero current 206 in response to the off signal.

The gated current offset module 210 includes a control module 214, a switch and a current source 212. The switch is activated based on a gate control signal 216 that is produced by the control module 214. The control module 214 produces the gated control signal 216 based on the reference oscillation 110 and its corresponding duty cycle. As graphically illustrated in FIG. 14, the positive current 118 is activated for a particular duration. The period of the positive current 118 corresponds to the period of the reference oscillation 110. Accordingly, the gated offset current 208, which corresponds to the duty cycle of the reference oscillation 110, is activated to sink current from the loop filter 104 during the time when the positive current 118 is being provided. As shown, the gated offset current 208 is time aligned with respect to the positive current 118. As such, the ripple on the control voltage 124 is reduced in comparison to the constant offset current sources. By reducing the ripple on the control voltage 124, the magnitude of the reference feed-through noise, or reference spurs, is reduced.

Figure 15:
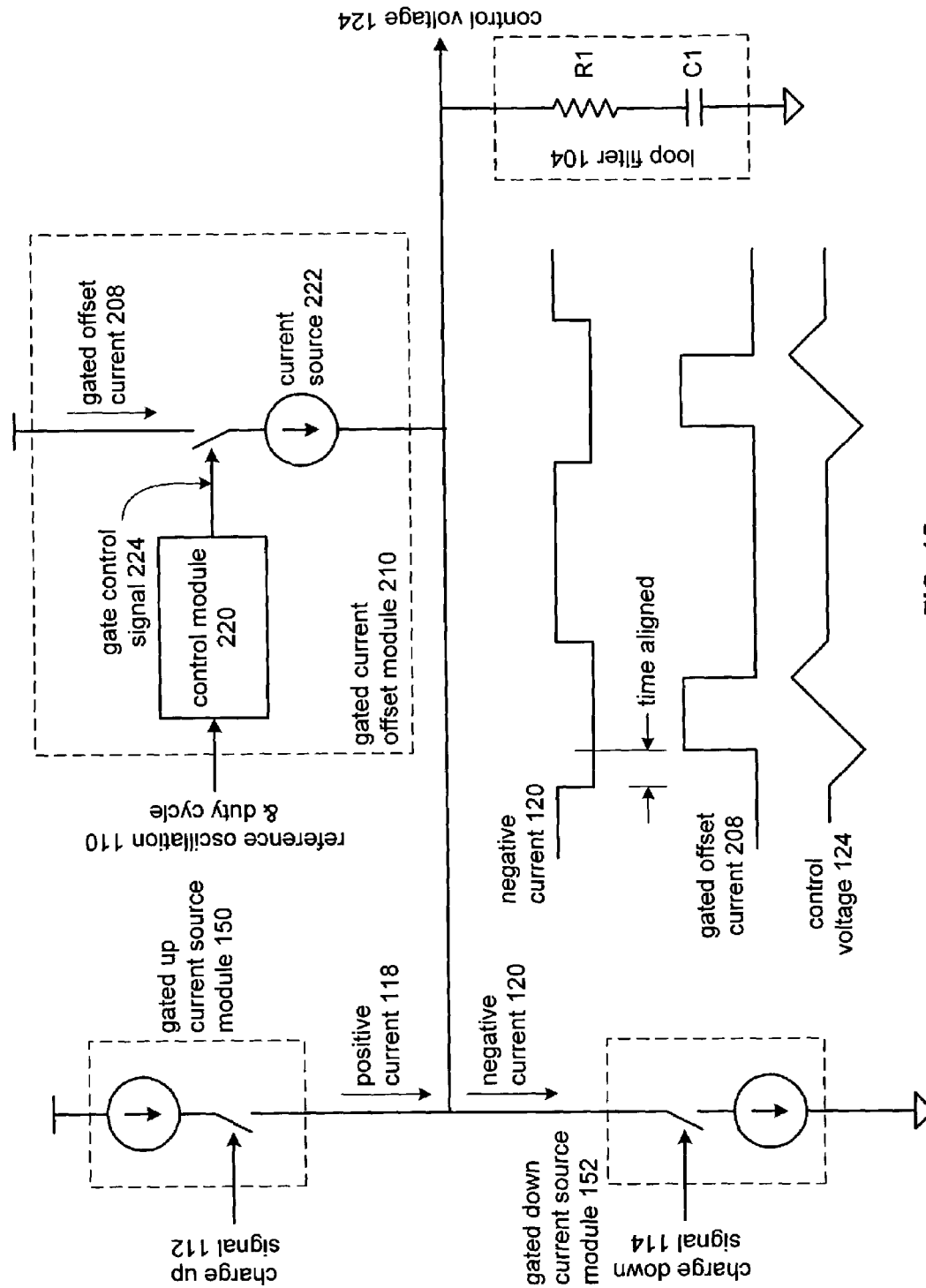
FIG. 15 is a schematic block diagram further illustrating an alternate embodiment of the components of the local oscillation module of FIG. 13.

FIG. 15 illustrates an alternate embodiment of the gated offset current module 210 of the local oscillation module 74 of FIG. 13. In this embodiment, the charge pump circuit 200 includes the gated-up current source module 150 and the gated-down current source module 152 and operate as previously discussed. Similarly, loop filter 104 includes resistor R1 and C1 and operates as previously discussed.

The gated current offset module 210 includes current source 222 and control module 220. The control module 220 produces a gate control signal 224 that closes a gate, which enables the current source 222 to produce the gated offset current 208. The control module 220 produces the gated control signal 224 based on the reference oscillation 110 and its corresponding duty cycle.

A graphical representation of the negative current 120 is illustrated to transition low and high corresponding to the activation and deactivation of the gated down current source module 152. The gated offset current 208 is shown to be time aligned with the negative current 120 and to be activated during a portion of the duration of the negative current 120. This minimizes the ripple on the control voltage 124.

FIG. 16 illustrates a logic diagram of a method for linearizing an oscillation synthesizer, such as a fractional-N synthesizer. One or more devices may implement the steps of FIG. 16, where a device performs a portion of a step, a full step or multiple steps. A device may be a single processing device or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when a device implements one or more of its functions via a state machine, analog circuitry, digital circuitry, and/or logic circuitry, the corresponding operational instructions are embedded with the circuitry comprising the state machine, analog circuitry, digital circuitry, and/or logic circuitry. In general, the memory stores, and the processing devices executes, operational instructions corresponding to at least some of the steps and/or functions illustrated in FIG. 16.

The process begins at Step 230 where a charge-up signal is generated when a reference oscillation leads a feedback oscillation. The process then proceeds to Step 232 where an off signal is generated when the charge-up signal is reset. The process then proceeds to Step 234 where a control signal is generated in response to the charge-up signal and the off signal. The process then proceeds to Step 236 where a cyclic offset signal is injected into the control signal to produce an offset control signal, which maintains the reference oscillation leading the feedback oscillation. The rate of injection corresponds to the reference oscillation, where the cyclic offset signal is a current or a voltage signal that may be sourced or sinked with respect to the control signal. The magnitude of the cyclic offset signal may be varied in accordance with an offset current control signal that is generated based on a fractional portion of a divider value.

The process then proceeds to Step 238 where an output oscillation is generated based on the offset control signal, which may be done by utilizing a voltage control oscillator. The process then proceeds to Step 240 where the feedback oscillation is generated by dividing the output oscillation by a divider value.

FIG. 17 illustrates a logic diagram of an alternate method for linearizing oscillation synthesis, including a fractional-N synthesis. One or more devices may implement the steps of FIG. 17, where a device performs a portion of a step, a full step or multiple steps. A device may be a single processing device or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when a device implements one or more of its functions via a state machine, analog circuitry, digital circuitry, and/or logic circuitry, the corresponding operational instructions are embedded with the circuitry comprising the state machine, analog circuitry, digital circuitry, and/or logic circuitry. In general, the memory stores, and the processing devices executes, operational instructions corresponding to at least some of the steps and/or functions illustrated in FIG. 17.

The process begins at Step 250 where a charge-down signal is generated when a reference oscillation lags a feedback oscillation. The process then proceeds to Step 252 where an off signal is generated when the charge-down signal is reset. The process then proceeds to Step 254 where a control signal is generated in response to the charge-down signal and the off signal. The process then proceeds to Step 256 where a cyclic offset signal is injected into the control signal to produce an offset control signal. The offset control signal maintains the reference oscillation lagging the feedback oscillation. The injection of the cyclic offset signal may be done by injecting a cyclic current, cyclic voltage, of a fixed magnitude of varying magnitude. The current may be a current sink or a current source and if of a varying magnitude, the magnitude is based on a fractional portion of the feedback divider value.

The process then proceeds to Step 258 where an output oscillation is generated based on the offset control signal. The process then proceeds to Step 260 where the feedback oscillation is generated by dividing the output oscillation by divider value.

The preceding discussion has presented a method and apparatus for linearizing the operation of a fractional-N synthesizer and/or other types of oscillation synthesizers. By offsetting the operation of a charge pump into its linear regions, the overall performance of the fractional-N synthesizer and/or oscillation synthesizer is improved. As one of average skill in the art will appreciate, other embodiments may be derived from the teaching of the present invention, without deviating from the scope of the claims.

What is claimed is:

1. A fractional-N synthesizer comprises:
   phase and frequency detection module operably coupled to produce a charge up signal, a charge down signal, or an off signal based on at least one of a phase difference and a frequency difference between a reference oscillation and a feedback oscillation;
   charge pump circuit produces a positive current in response to the charge up signal, a negative current in response to the charge down signal, and zero current in response to the off signal;
   gated current offset module operably coupled to cyclically provide a gated offset current based on the reference oscillation wherein the gated current offset module includes:
      current source operably coupled to cyclically source current to the loop filter;
      switch operable to couple the current source to the loop filter in accordance with a gate control signal; and
      control module operably coupled to generate the gate control signal based on the reference oscillation and predetermined duty cycle such that the gated offset current is aligned with the negative current;
   loop filter operably coupled to filter at least some of: the positive current, the negative current, the zero current, and the gated offset current to produce a control voltage;
   voltage controlled oscillator to produce an output oscillation based on the control voltage; and
   fractional-N divider module operably coupled to divided the output oscillation by a fractional N value to produce the feedback oscillation.

2. The fractional-N synthesizer of claim 1, wherein the current source further comprises:
   a programmable current source to provide a varying gated offset current in accordance with an offset current control signal, wherein the control module generates the offset current control signal based on the fractional N value.

3. The fractional-N synthesizer of claim 1, wherein the gated current offset module further comprises:
   the control module is operably coupled to produce the gate control signal at a rate of the reference oscillation, a multiple of the reference oscillation, or a division of the reference oscillation.

4. A method for linearizing an oscillation synthesizer, the method comprises:
   generating a charge up signal when a reference oscillation leads a feedback oscillation;
   generating an off signal when the charge up signal is reset;
   generating a control signal in response to the charge up signal and the off signal;
   injecting, at a rate corresponding to the reference oscillation, a cyclic offset signal into the control signal to produce an offset control signal by enabling, in accordance with a gate control signal, a current sink to reduce magnitude of the control signal, and generating the gate control signal based on the reference oscillation and a predetermined duty cycle such that the enabling of the current sink is aligned with the charge up signal, wherein the offset control signal maintains the reference oscillation leading the feedback oscillation;
   generating an output oscillation based on the offset control signal; and
   generating the feedback oscillation by dividing the output oscillation by a divider value.

5. The method of claim 4 further comprises:
   varying magnitude of the current sink in accordance with an offset current control signal; and
   generating the offset current control signal based on the divider value.

6. A method for linearizing an oscillation synthesizer, the method comprises:
   generating a charge down signal when a reference oscillation lags a feedback oscillation;
   generating an off signal when the charge down signal is reset;
   generating a control signal in response to the charge down signal and the off signal;
   injecting, at a rate corresponding to the reference oscillation, a cyclic offset signal into the control signal to produce an offset control signal by enabling, in accordance with a gate control signal, a current sink to reduce magnitude of the control signal, and generating the gate control signal based on the reference oscillation and a predetermined duty cycle such that the enabling of the current sink is aligned with the charge up signal, wherein the offset control signal maintains the reference oscillation leading the feedback oscillation;
   generating an output oscillation based on the offset control signal; and
   generating the feedback oscillation by dividing the output oscillation by a divider value.

7. The method of claim 6 further comprises:
varying magnitude of the current source in accordance with an offset current control signal; and
generating the offset current control signal based on the divider value.

8. A linearized oscillation synthesizer comprises:
means for generating a charge up signal when a reference oscillation leads a feedback oscillation;
means for generating an off signal when the charge up signal is reset;
means for generating a control signal in response to the charge up signal and the off signal;
means for injecting, at a rate corresponding to the reference oscillation, a cyclic offset signal into the control signal to produce an offset control signal by enabling, in accordance with a gate control signal, a current sink to reduce magnitude of the control signal, and generating the gate control signal based on the reference oscillation and a predetermined duty cycle such that the enabling of the current sink is aligned with the charge up signal, wherein the offset control signal maintains the reference oscillation leading the feedback oscillation;
means for generating an output oscillation based on the offset control signal; and
means for generating the feedback oscillation by dividing the output oscillation by a divider value.

9. The linearized oscillation synthesizer of claim 8 further comprises:
means for varying magnitude of the current sink in accordance with an offset current control signal; and
means for generating the offset current control signal based on the divider value.

10. A linearized oscillation synthesizer comprises:
means for generating a charge down signal when a reference oscillation lags a feedback oscillation;
means for generating an off signal when the charge down signal is reset;
means for generating a control signal in response to the charge down signal and the off signal;
means for injecting, at a rate corresponding to the reference oscillation, a cyclic offset signal into the control signal to produce an offset control signal by enabling, in accordance with a gate control signal, a current sink to reduce magnitude of the control signal, and generating the gate control signal based on the reference oscillation and a predetermined duty cycle such that the enabling of the current sink is aligned with the charge up signal, wherein the offset control signal maintains the reference oscillation leading the feedback oscillation;
means for generating an output oscillation based on the offset control signal; and
means for generating the feedback oscillation by dividing the output oscillation by a divider value.

11. The linearized oscillation synthesizer of claim 10 further comprises:
means for varying magnitude of the current source in accordance with an offset current control signal; and
means for generating the offset current control signal based on the divider value.

12. A radio comprising:
transmitter section operably coupled to convert outbound data into outbound radio frequency (RF) signals based on a transmitter local oscillation;
receiver section operably coupled to convert inbound RF signals into inbound data based on a receiver local oscillation; and
local oscillator operably coupled to produce the transmitter local oscillation and the receiver local oscillation, wherein the local oscillator includes:
phase and frequency detection module operably coupled to produce a charge up signal, a charge down signal, or an off signal based on at least one of a phase difference and a frequency difference between a reference oscillation and a feedback oscillation;
charge pump circuit produces a positive current in response to the charge up signal, a negative current in response to the charge down signal, and zero current in response to the off signal;
gated current offset module operably coupled to cyclically provide a gated offset current based on the reference oscillation, wherein the gated current offset module includes:
current source operably coupled to cyclically source current to the loop filter;
switch operable to couple the current source to the loop filter in accordance with a gate control signal; and
control module operably coupled to generate the gate control signal based on the reference oscillation and predetermined duty cycle such that the gated offset current is aligned with the negative current;
loop filter operably coupled to filter at least some of: the positive current, the negative current, the zero current, and the gated offset current to produce a control voltage;
voltage controlled oscillator to produce an output oscillation based on the control voltage, wherein the transmitter and receiver local oscillations are based on the output oscillation; and
fractional-N divider module operably coupled to divided the output oscillation by a fractional N value to produce the feedback oscillation.

13. The radio of claim 12, wherein the current source further comprises:
a programmable current source to provide a varying gated offset current in accordance with an offset current control signal, wherein the control module generates the offset current control signal based on the fractional N value.

14. The radio of claim 12, wherein the gated current offset module further comprises:
the control module is operably coupled to produce the gate control signal at a rate of the reference oscillation, a multiple of the reference oscillation, or a division of the reference oscillation.

15. A radio comprising:
transmitter section operably coupled to convert outbound data into outbound radio frequency (RF) signals based on a transmitter local oscillation;
receiver section operably coupled to convert inbound RF signals into inbound data based on a receiver local oscillation; and
local oscillator operably coupled to produce the transmitter local oscillation and the receiver local oscillation, wherein the local oscillator includes:
means for generating a charge up signal when a reference oscillation leads a feedback oscillation;
means for generating an off signal when the charge up signal is reset;

means for generating a control signal in response to the charge up signal and the off signal;

means for injecting, at a rate corresponding to the reference oscillation, a cyclic offset signal into the control signal to produce an offset control signal by enabling, in accordance with a gate control signal, a current sink to reduce magnitude of the control signal, and generating the gate control signal based on the reference oscillation and a predetermined duty cycle such that the enabling of the current sink is aligned with the charge up signal, wherein the offset control signal maintains the reference oscillation leading the feedback oscillation;

means for generating an output oscillation based on the offset control signal; and means for generating the feedback oscillation by dividing the output oscillation by a divider value.

16. The radio of claim 15, wherein the local oscillator further comprises:

means for varying magnitude of the current sink in accordance with an offset current control signal; and means for generating the offset current control signal based on the divider value.

17. A radio comprising:

transmitter section operably coupled to convert outbound data into outbound radio frequency (RF) signals based on a transmitter local oscillation;

receiver section operably coupled to convert inbound RF signals into inbound data based on a receiver local oscillation; and local oscillator operably coupled to produce the transmitter local oscillation and the receiver local oscillation, wherein the local oscillator includes:

means for generating a charge down signal when a reference oscillation lags a feedback oscillation;

means for generating an off signal when the charge down signal is reset;

means for generating a control signal in response to the charge down signal and the off signal;

means for injecting, at a rate corresponding to the reference oscillation, a cyclic offset signal into the control signal to produce an offset control signal by enabling, in accordance with a gate control signal, a current sink to reduce magnitude of the control signal, and generating the gate control signal based on the reference oscillation and a predetermined duty cycle such that the enabling of the current sink is aligned with the charge up signal, wherein the offset control signal maintains the reference oscillation leading the feedback oscillation;

generate the gate control signal based on the reference oscillation and a predetermined duty cycle such that the enabling of the current sink is aligned with the charge up signal;

means for generating an output oscillation based on the offset control signal; and means for generating the feedback oscillation by dividing the output oscillation by a divider value.

18. The radio of claim 17, wherein the local oscillator further comprises:

means for varying magnitude of the current source in accordance with an offset current control signal; and means for generating the offset current control signal based on the divider value.

* * * * *